(12) United States Patent
Chen et al.

(10) Patent No.: US 7,491,621 B2
(45) Date of Patent: Feb. 17, 2009

(54) METHOD OF FORMING ISOLATION STRUCTURES IN A SEMICONDUCTOR MANUFACTURING PROCESS

(75) Inventors: Chun Fu Chen, Taipei (TW); Yung Tai Hung, Chiayi (TW); Chi Tung Huang, Hsinchu (TW); Chen Wei Liao, Nantou (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 11/342,784

(22) Filed: Jan. 30, 2006

(65) Prior Publication Data

US 2007/0178662 A1 Aug. 2, 2007

(51) Int. Cl.
*H01L 21/76* (2006.01)

(52) U.S. Cl. ............... 438/424; 438/435; 257/E21.546

(58) Field of Classification Search .................. 438/424, 438/435, 405, 436, 437, 438
See application file for complete search history.

(56) References Cited

U.S. PATENT DOCUMENTS

| | | | | |
|---|---|---|---|---|
| 4,960,727 A | * | 10/1990 | Mattox et al. ............... | 438/437 |
| 5,817,567 A | * | 10/1998 | Jang et al. .................. | 438/427 |
| 5,872,043 A | * | 2/1999 | Chen .......................... | 438/424 |
| 6,037,237 A | * | 3/2000 | Park et al. ................... | 438/424 |
| 6,235,606 B1 | * | 5/2001 | Huang et al. ................ | 438/400 |
| 6,235,608 B1 | * | 5/2001 | Lin et al. .................... | 438/424 |
| 6,784,077 B1 | * | 8/2004 | Lin et al. .................... | 438/426 |
| 2002/0137339 A1 | * | 9/2002 | Takeuchi .................... | 438/688 |
| 2004/0135066 A1 | * | 7/2004 | Lim ........................ | 250/208.1 |
| 2004/0203247 A1 | * | 10/2004 | Wu et al. ................... | 438/706 |

OTHER PUBLICATIONS

Furukawa et al., "Effects of oxygen content on properties of silicon oxide films prepared at room temperature by sputtering-type electron cyclotron resonance plasma", Oct. 13, 1998, Journal of Applied Physics, vol. 84, No. 8, pp. 4579-4584.*

* cited by examiner

*Primary Examiner*—Alexander G Ghyka
*Assistant Examiner*—Reema Patel
(74) *Attorney, Agent, or Firm*—Baker & McKenzie LLP

(57) ABSTRACT

A method for forming shallow trench isolation structures is disclosed. The methods include providing a substrate having an upper surface and having an opening extending down from said upper surface, providing a first dielectric layer over at least a portion of the upper surface of the substrate and filling the opening, providing a second dielectric layer over the first dielectric layer, and removing portions of the first and second dielectric layers, wherein the first dielectric layer has a higher index of refraction than the second dielectric layer.

17 Claims, 2 Drawing Sheets

METHOD OF FORMING ISOLATION STRUCTURES IN A SEMICONDUCTOR MANUFACTURING PROCESS

BACKGROUND

1. Field of the Invention

Embodiments of the invention relate to methods for polishing regions of semiconductor wafers. In particular embodiments, the invention relates to methods of polishing a wafer to form isolation structures.

2. Background of the Invention

During the manufacture of semiconductor devices, a wafer undergoes a sequence of photolithography-etching steps to produce a plurality of patterned layers. In order to avoid adjacent devices from shorting to one another, and in order to avoid leakage between devices formed in close proximity to one another, shallow trench isolation (STI) structures have become a commonly used feature in the semiconductor manufacturing industry.

The process for forming an STI structure typically involves forming a trench-like opening in a silicon substrate, then filling the trench opening with an insulating material. The insulating materials may be formed by deposition techniques such as low pressure chemical vapor deposition (LPCVD), high density plasma (HDP) deposition, or any other suitable method for depositing an insulating material within a trench opening. After the opening is filled with a deposited insulating material, a polishing process is used to planarize the surface by removing any portions of the insulating material which may be formed above the upper plane beneath which the trench opening extends.

A nitride, such as silicon nitride, or other oxidation resistant, and suitably hard films, are typically used as hard masks for trench-formation silicon etches and also as polishing stop layers for CMP operations. In this manner, the nitride or other, hard, oxidation-resistant film forms the upper surface beneath which the trench opening extends. Hard films have relatively low removal rates and may be referred to as polishing stop layers.

During the formation of STI structures, problems arise when the polishing operations used to polish the insulating material and planarize the STI structure, cause "dishing" on the top of the STI structure. Dishing describes the phenomena wherein the top surface of the insulating material within the trench, becomes recessed below the upper surface of the polishing stop layer such as silicon nitride. Typically, the central portion of the top surface of the STI structure is recessed below the peripheral portion of the top surface of the STI structure. The peripheral edges of the STI structure generally extend up the side of the trench opening to intersect the upper surface of the polishing stop layer at the edges of the trench opening. Sharp, upward projections of the insulating material may therefore result at these peripheral edges.

After the STI structure is completed, the sharp, upward projections may remain at the edges of the STI structure which may additionally extend above the upper surface of the semiconductor substrate by as much as 500 Å, and may extend above the surrounding semiconductor substrate by an even greater distance. These sharp upward projections in the STI structure created by dishing can cause other electrical problems which may result in device failure, or which may require additional implants to compensate for changed parametric characteristics, or both.

SUMMARY

A method for forming shallow trench isolation structures includes providing a substrate having an upper surface and having an opening extending down from said upper surface, providing a first dielectric layer over at least a portion of the upper surface of the substrate and filling the opening, providing a second dielectric layer over the first dielectric layer, and removing portions of the first and second dielectric layers.

In one aspect, the first dielectric layer has a higher index of refraction than the second dielectric layer.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION OF THE PREFERRED EMBODIMENTS

In the following description, all numbers disclosed herein are approximate values, regardless whether the word "about" or "approximately" is used in connection therewith. They may vary by up to 1%, 2%, 5%, or sometimes 10 to 20%. Whenever a numerical range with a lower limit, RL, and an upper limit RU, is disclosed, any number R falling within the range is specifically and expressly disclosed. In particular, the following numbers R within the range are specifically disclosed: $R=RL+k*(RU-RL)$, wherein k is a variable ranging from 1% to 100% with a 1% increment, i.e. k is 1%, 2%, 3%, 4%, 5%, ..., 50%, 51%, 52%, ..., 95%, 96%, 97%, 98%, 99%, or 100. Moreover, any numerical range defined by two numbers, R, as defined in the above is also specifically disclosed. It is also emphasized that in accordance with the standard practice in the semiconductor industry, various features may not be drawn to scale. In fact, the dimensions of the various features may be arbitrarily increased or reduced for clarity of discussion.

Embodiments of the present invention provide a method for reducing dishing related issues which occur during the formation of shallow trench isolation (STI) structures. More specifically, embodiments of the invention provide a method that includes providing a substrate having an upper surface and having an opening extending into the substrate from the upper surface; providing a first dielectric layer over at least a portion of the upper surface of the substrate and filling the opening; providing a second dielectric layer over the first dielectric layer; and removing portions of the first and second dielectric layers; wherein the first dielectric layer has a higher index of refraction than the second dielectric layer.

Figure 1:
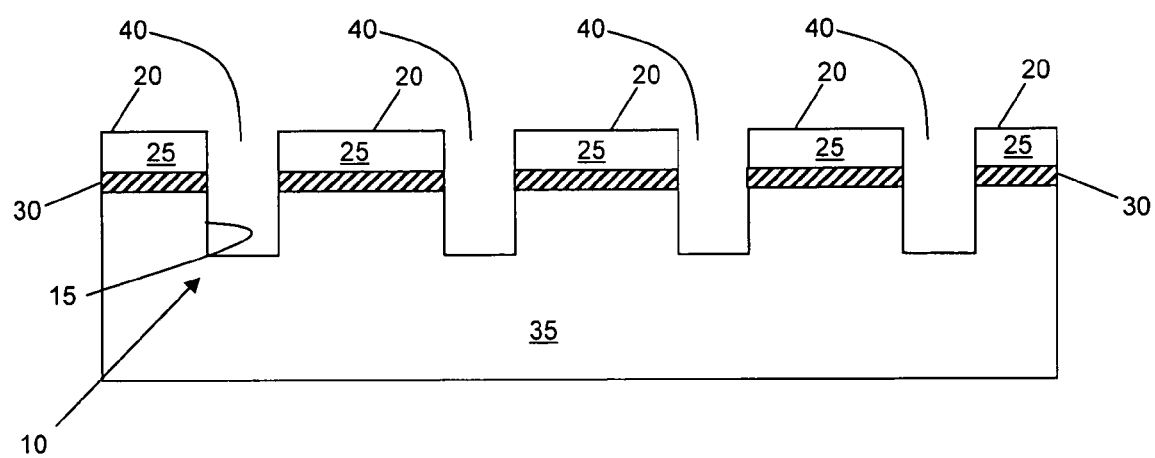
FIG. 1 illustrates a wafer at an intermediate phase of processing before the trenches of the STI structure are filled.

Referring now to FIG. 1, there is illustrated an example of a shallow trench isolation structure which exhibits dishing. The structure shown in FIG. 1 is presented to demonstrate the dishing issues associated with STI structures which are formed by polishing methods such as chemical mechanical polishing. Dishing results because the deposited dielectric material which fills the trenches, has a higher polishing rate than the polishing stop layer used. These deposited dielectric materials are typically formed by any of various chemical vapor deposition (CVD) techniques. In order to ensure complete removal of the deposited dielectric material from over the polishing stop layer, a sufficient amount of polishing is used which recesses the upper surface of the deposited dielectric within the trench and below the surface of the polishing stop film.

As shown in FIG. 1, shallow trench isolation structure 10 is formed having a trench opening 40 with sidewall 15 and extending down from upper surface 20, through polishing stop layer 25, through pad oxide film 30, and into semiconductor substrate 35. In an exemplary embodiment, trench opening 40 may be formed by an etching operation which etches in succession polishing stop layer 25 and pad oxide film 30, thereby removing these films, and which continues to etch the trench opening 40 which extends into substrate 35. Conventional etching methods may be used. In one embodiment, semiconductor substrate 35 may be a silicon wafer as commonly used in the semiconductor manufacturing industry. In some embodiment, pad oxide film 30 may be a thermally grown silicon dioxide, or "oxide", film having a thickness ranging from 50 to 200 angstroms, but other pad oxide films having different thicknesses may be used alternatively.

Polishing stop layer 25 is typically a silicon nitride film, but other oxidation resistant films which are relatively hard and resistant to polishing, may be used in alternative embodiments. Polishing stop layer 25 is usually chosen to have a low polishing rate, or high polishing resistance, under the desired polishing conditions. Although polishing stop layer 25 may be a film other than silicon nitride in various alternative embodiments, hereinafter polishing stop layer 25 will be referred to as silicon nitride, or simply nitride film 25. Nitride film 25 typically has a thickness within the range of 1000 to 2500 angstroms. In one embodiment, the thickness of pad oxide film 30 and nitride film 25 ranges from 1600 to 2000 angstroms. In an exemplary embodiment, depth of trench opening 40 may be on the order of 3500 to 6500 angstroms.

Trench opening 40 is formed by etching, as above, and is formed prior to the formation of STI structure 10. Trench opening 40 may extend down into semiconductor substrate 35 by a depth ranging from 2500 to 3500 angstroms according to various exemplary embodiments. The width of the trench opening 40 may be of any suitable dimension, but is typically 0.1 microns or greater and in some embodiments is 0.1 to 0.5 microns. While any ratio of trench with respect to trench height may be used, this ratio typically does not exceed 6.0.

Figure 2:
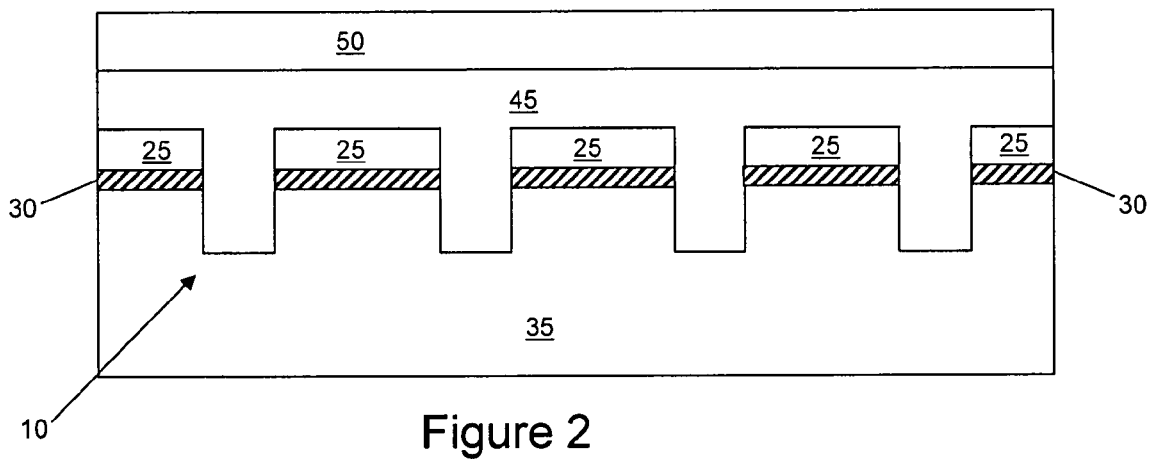
FIG. 2 illustrates a wafer having STI structures formed therein wherein first and second dielectric layers are formed.

Referring now to FIG. 2, trench opening 40 of FIG. 1 is filled by depositing a film of a first dielectric material 45 over upper surface 20 of nitride film 25, and also within and filling trench opening 40. The first dielectric layer 45 will commonly be an oxide film formed by any of various CVD methods. In one embodiment, the first dielectric layer is a silicon dioxide layer that is formed by a high density plasma process. In some embodiments, a thermally grown oxide layer having a thickness ranging from about 100 angstroms to about 300 angstroms, may additionally be grown on the inner surfaces of trench opening 40 to cure any etch defects and to prevent defects which may be caused by subsequent cleaning processes.

While any desirable conditions can be used, in one embodiment, the first dielectric layer 45 is a silicon dioxide layer deposited by high density plasma at a pressure ranging from 0.1 mTorr to about 1 Torr, and a power of from about 1,000 watts to about 5,000 watts, with the power representing both radio frequency and bias. In a deposition chamber, substrate 35 is maintained at a temperature of from about 200° C. to about 700° C., and preferably about 600° C., by flowing helium against a backside of substrate 35. Silane is provided to the reaction chamber at a rate of from about 50 standard cubic centimeters per minute (sccm) to about 150 sccm, with a preferred flow rate of about 200 sccm. Oxygen (O2) is provided into the chamber at a rate of from about 50 sccm to about 150 sccm, with a preferred rate of about 100 sccm, and argon is flowed into the chamber at a rate of from about 200 sccm to about 1000 sccm, with a preferred rate of about 500 sccm. The relative flow rates of the silane and oxygen can be adjusted to provide a silicon dioxide layer having the desired silicon:oxygen ratio.

Typically, in forming the first dielectric layer 45, the flow rate are selected to provide a silicon dioxide layer that is relatively rich in silicon. A relatively silicon-rich layer has a silicon content higher than that of the second dielectric layer 50. In some embodiments such relatively silicon rich layer have an index of refraction of about 1.52 to about 1.58. In other embodiments, the lower end of the range of the index of refraction for the first dielectric layer 45 is 1.53, 1.54, 1.55, 1.56 or about 1.57. In some embodiments the index of refraction of the first dielectric layer 45 is about 1.54, 1.55, 1.56, 1.57, or 1.58. Determination of the index of refraction for dielectric layers on silicon substrates is known. One suitable method for measuring the index of refraction is described in ASTM F 576-01.

Typically, the removal rate of the first dielectric layer is about 1000 to about 3000 angstroms per minute under the selected polishing conditions. In some embodiments, the removal rate ranges from about 1100 to about 2750 angstroms per minute. In other embodiments, the removal rate ranges from about 1200 to about 2000 angstroms per minute. In still other embodiments, the removal rate of the first dielectric layer under the selected polishing conditions is about 1000 to 1500 angstroms per minute.

After formation of the first dielectric layer 45 to a desired depth, the temperature of the wafer is reduced and the second dielectric layer 50 is formed. The temperature can be dropped by increasing a flow of helium against a backside of substrate 35. Typically, the temperature of the substrate is maintained in the range of about 300° C. to about 400° C. The flow rates of silane and oxygen to the deposition chamber are adjusted to provide a dielectric layer that has a higher ratio of oxygen to silicon than the first dielectric layer 45. While in this embodiment the formation of the second dielectric layer 50 is provided by high density plasma deposition, any deposition or other type method suitable for providing a dielectric layer may be used so long as it is capable of providing a dielectric layer having the described properties.

The second dielectric layer 50 is formed to have a higher removal rate than the first dielectric layer 45. In some embodiments, the removal rate of the second dielectric layer is about 1.5 to about 4 times faster than removal rate of the first dielectric layer 45 under the same process conditions. In other embodiments, the removal rate of the second dielectric layer 50 is about 2.0 to about 3.5 times the removal rate of the first dielectric layer 45. In still other embodiments the dielectric layer 50 is removed at a rate of about 2.7 to about 3.0 time the rate at which the first dielectric layer 45 is removed under the process conditions. Typically, the removal rate is related to the amount of oxygen in the layer. In other words, a layer with relatively more oxygen can be expected to have a higher removal rate under a given set of polishing conditions, although this relationship is not necessarily linear.

Another way of selecting the second dielectric layer 50 is according to its index of refraction. Typically, the second dielectric layer 50 has a lower index of refraction than the first dielectric layer 45. In some embodiments the second dielectric layer 50 has an index of refraction that is less than the index of refraction of the first dielectric layer 45. Preferably, the index of refraction ranges from about 1.50 to about 1.55, preferably about 1.50 to about 1.52.

In addition while the first and second dielectric layers described above are referred to as discrete, individual layers, it should be understood that they may also be a single layer having a relatively continuous or discontinuous chemical composition. To provide the dielectric layers as a relatively single layer having a continuous or discontinuous compositional gradient, the reaction conditions in the deposition chamber may be changed gradually, or alternatively in discrete amounts.

Figure 3:
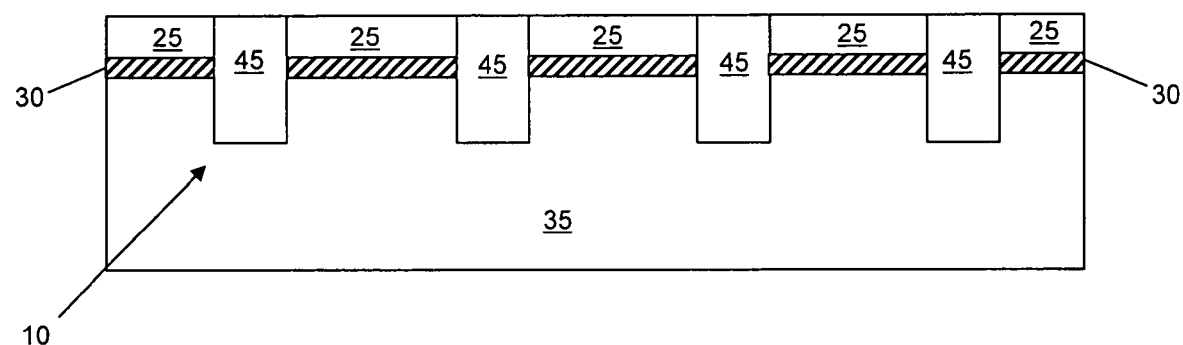
FIG. 3 illustrates a wafer having STI structures formed therein after the dielectric layers have been removed by polishing.

FIG. 3 depicts the structure 10 after the first and second dielectric layers are removed by polished according to any desired procedure to remove undesired portions of the dielectric material above the nitride film 25 and leaving the trench 40 filled with the material the first dielectric layer 45. Nitride film 25 is chosen for its relative hardness and resistance to being removed by polishing to provide a substantially planar surface which is substantially coplanar with upper surface 20 of nitride film 25. The polishing can be performed according to any desired means. Some polishing means are described in U.S. Pat. No. 6,824,452, incorporated herein by reference in its entirety.

In some embodiments a substantially single polishing procedure is used. But in some embodiments, a soft polishing pad is used initially and polishing is accomplished by providing a slurry with an abrasive to a soft polishing pad. In one embodiment the abrasive is $CeO_2$ but any abrasive may be used. The material of the soft polishing pad is a flexible and deformable material, preferably not nonwoven fabric made of a urethane, an amide, a carbonate, an ester; an ether, an acrylate; methacrylate; an acrylic acid; a methacrylic acid, a sulphone, an acrylamide, a halide; an imide; a carboxyl; a carbonyl; an amino, an aldehydric; a urea and a hydroxyl. In some embodiments the pad is selected to have a hardness of 30-35 Shore D; a density of 0.30-0.40 g/cm$^3$; a compressibility of 2.0-3.0%; and a rebound of 70-100%.

In a second stage chemical mechanical polishing process is performed using a relatively hard polishing pad. Slurry with an abrasive, such as CeO2 is supplied to the hard polishing pad which comprises a urethane, an amide, a carbonate, an ester; an ether, an acrylate; methacrylate; an acrylic acid; a methacrylic acid, a sulphone, an acrylamide, a halide; an imide; a carboxyl; a carbonyl; an amino, an aldehydric; a urea and a hydroxyl. Typically, the hard polishing pad has a hardness of 50-65 Shore D; a density of 0.60-0.80 g/cm$^3$; a compressibility of 2.0-3.0%; and a rebound of 70-100%. When a hard polishing pad is used it should be selected to have a higher density and a lower porosity than the soft pad.

In some embodiments, a combination pad having both soft and hard characteristics, as described in U.S. Pat. No. 6,824,452 may be used.

Figure 4:
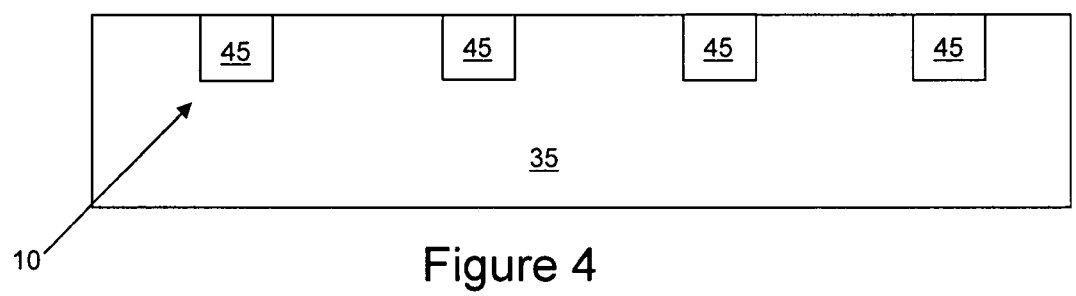
FIG. 4 illustrates a wafer having STI structures after the stop layer and pad oxide are removed.

One feature provided by embodiments of the invention is that a substantially planar upper surface with reduced dishing may be achieved. When subsequent processing operations are carried out using conventional means to remove nitride film 25 and subjacent pad oxide film 30, upper surface 31 of STI Structure 10 may become recessed during the removal operations, but will remain substantially planar. FIG. 4 shows STI Structure 10 after various conventional procedures have been performed to remove nitride film 25, and pad oxide film 30 shown in FIG. 3. In one embodiment, nitride film 25 is removed by etching in hot phosphoric acid at a temperature of about 160°, and pad oxide film 30 may be subsequently etched using hydrofluoric acid. Prior to the removal of nitride film 25, a conventional deglazing procedure may optionally be carried out to remove any trace amounts of oxide from over nitride film 25, according to common methods.

The new device has one or more of the following advantages. First, the new composition has better durability. In some instances, only one current carrying line is required to write to the device. Cross-talk is also reduced by certain embodiments. Thus, more devices can be placed in a smaller area without loss of signal or memory integrity. Other characteristics and additional advantages are apparent to those skilled in the art.

While the invention has been described with respect to a limited number of embodiments, the specific features of one embodiment should not be attributed to other embodiments of the invention. No single embodiment is representative of all aspects of the inventions. Moreover, variations and modifications therefrom exist. For example, the magnetic memory devices and methods of storing data described herein can be used in any circuit using circuit design tools. In some embodiments, the devices are substantially free or essential free of any feature on specifically enumerated herein. Some embodiments of the method described herein consist of or consist essentially of the enumerated steps. The appended claims intend to cover all such variations and modifications as falling within the scope of the invention.

What is claimed:

1. A method for forming a shallow trench isolation structure, comprising:
   a) providing a substrate having an upper surface and having an opening extending down from the upper surface;
   b) providing a first dielectric layer having an index of refraction that is higher than about 1.52 and directly in contact with at least a portion of the upper surface of the substrate and filling the entire opening;
   c) providing a second dielectric layer over the first dielectric layer; and
   d) removing a portion of the first dielectric layer and substantially all of the second dielectric layer;
   wherein the first dielectric layer has a different index of refraction than the second dielectric layer.

2. The method according to claim 1, wherein the first dielectric layer comprises silicon dioxide.

3. The method according to claim 1 wherein the first dielectric layer is comprised of a silicon-rich silicon dioxide which is deposited by a high density plasma process.

4. The method as in claim 1, wherein the second dielectric layer comprises silicon dioxide.

5. The method according to claim 4, wherein the silicon dioxide has an index of refraction of less than about 1.52.

6. The method according to claim 1, wherein the first dielectric layer is a silicon dioxide layer formed by high density plasma deposition under a first set of deposition conditions and the second dielectric layer is a silicon dioxide layer formed under a second set of deposition conditions; wherein the first set of deposition conditions provides a silicon dioxide layer having a silicon content higher than silicon content of the second layer formed by the second set of deposition conditions.

7. The method according to claim 1, wherein the first dielectric layer has an oxide removal rate of less than about 2500 Å per minute and the second dielectric layer has an index of refraction of less than about 1.51 and an oxide removal rate of greater than about 2500 Å per minute.

8. The method according to claim 1, wherein providing the first dielectric layer and the second dielectric layer are performed sequentially by changing the silane or oxygen flow rates.

9. The method as in claim 1, in which said step (a) includes providing a semiconductor substrate having said first material formed thereover, said opening extending through said first material and extending into said semiconductor substrate by a depth ranging from 2500 Å to 3500 Å.

10. A method for forming a shallow trench isolation structure, comprising:
 a) providing a substrate having an upper surface formed of silicon nitride and an opening extending down from the upper surface, said opening entirely filled with a first dielectric material having an index of refraction that is higher than about 1.52 and directly in contact with at least a portion of the upper surface;
 b) providing a second dielectric material over the first dielectric material;
 wherein the second dielectric material has a different index of refraction than the first dielectric.

11. The method according to claim 10, wherein the first dielectric layer comprises silicon dioxide.

12. The method according to claim 10, wherein the first dielectric material is comprised of a silicon rich silicon dioxide which is deposited by a high density plasma process.

13. The method as in claim 10, wherein the second dielectric layer comprises silicon dioxide.

14. The method according to claim 13, wherein the silicon dioxide has an index of refraction of less than about 1.52.

15. The method according to claim 10, wherein the first dielectric layer is a silicon dioxide layer formed by high density plasma deposition under a first set of deposition conditions and the second dielectric layer is a silicon dioxide layer formed under a second set of deposition conditions; wherein the first set of deposition conditions provides a silicon dioxide layer having a silicon content higher than silicon content of the second layer formed by the second set of deposition conditions.

16. The method according to claim 10, wherein the first dielectric layer has an oxide removal rate of less than about 2500 Å per minute and the second oxide layer has an index of refraction of less than about 1.51 and an oxide removal rate of greater than about 2500 Å per minute.

17. The method according to claim 10, wherein providing the first dielectric layer and the second dielectric layer are performed sequentially by changing the silane or oxygen flow rates.

* * * * *